US009817461B2

United States Patent
Ohida et al.

(10) Patent No.: US 9,817,461 B2
(45) Date of Patent: Nov. 14, 2017

(54) ABNORMALITY DISPLAY DEVICE INCLUDING A SWITCH TO CONTROL A DISPLAY ELEMENT TO INDICATE ABNORMAL OR NORMAL OPERATIONS FOR PLURAL SYSTEMS

(71) Applicants: Masanori Ohida, Kanagawa (JP); Shimpei Sonoda, Kanagawa (JP)

(72) Inventors: Masanori Ohida, Kanagawa (JP); Shimpei Sonoda, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 150 days.

(21) Appl. No.: 14/548,463

(22) Filed: Nov. 20, 2014

(65) Prior Publication Data
US 2015/0161925 A1 Jun. 11, 2015

(30) Foreign Application Priority Data
Dec. 5, 2013 (JP) .................................. 2013-252442

(51) Int. Cl.
*G06F 1/28* (2006.01)
*G01R 19/165* (2006.01)

(52) U.S. Cl.
CPC .......... *G06F 1/28* (2013.01); *G01R 19/16538* (2013.01)

(58) Field of Classification Search
CPC ............................ G06F 1/28; G01R 19/16538
See application file for complete search history.

(56) References Cited

U.S. PATENT DOCUMENTS

| | | | | |
|---|---|---|---|---|
| 5,332,993 A | * | 7/1994 | Ninomiya ................. | H02H 3/24 340/635 |
| 2006/0001403 A1 | * | 1/2006 | Yudahira ........... | G01R 19/16542 320/134 |
| 2007/0096719 A1 | * | 5/2007 | Wang ............... | G01R 19/16538 324/142 |
| 2008/0258927 A1 | * | 10/2008 | Chen ......................... | G06F 1/28 340/661 |

(Continued)

FOREIGN PATENT DOCUMENTS

| | | |
|---|---|---|
| JP | 57-106920 | 3/1982 |
| JP | 58-146861 | 9/1983 |
| JP | 4-172539 | 6/1992 |

(Continued)

*Primary Examiner* — Ryan A Lubit
(74) *Attorney, Agent, or Firm* — Harness, Dickey & Pierce, P.L.C.

(57) ABSTRACT

An abnormality display device for an electronic apparatus includes power source circuits (1) each being used inside systems of the electronic apparatus and generating each of system voltages, a voltage monitoring circuit (2) that turns on an input power source of the electronic apparatus and detects whether each system voltage normally rises up before the electronic apparatus rises, display elements (6*b* to 6*d*) that show whether an abnormality occurs in any of the system voltages through input of a signal from the voltage monitoring circuit (2), and switching elements (5*a* to 5*c*) in which a switching signal is input after each system voltage rises. The switching signal switches the display elements from a display mode used to show the abnormality of each system voltage to a display mode other than the display mode used to show the abnormality of each system voltage.

15 Claims, 4 Drawing Sheets

(56) References Cited

U.S. PATENT DOCUMENTS

2014/0164815 A1\* 6/2014 Wang .................... G06F 1/26
  713/340

FOREIGN PATENT DOCUMENTS

| | | |
|---|---|---|
| JP | 4-199188 | 7/1992 |
| JP | 07-028784 Y | 6/1995 |
| JP | 2000-188829 A | 7/2000 |

\* cited by examiner

ABNORMALITY DISPLAY DEVICE INCLUDING A SWITCH TO CONTROL A DISPLAY ELEMENT TO INDICATE ABNORMAL OR NORMAL OPERATIONS FOR PLURAL SYSTEMS

CROSS-REFERENCE TO RELATED APPLICATION

The present application is based on and claims priority from Japanese Patent Application Number 2013-252442, filed on Dec. 5, 2013, the disclosure of which is hereby incorporated by reference herein in its entirety.

BACKGROUND OF THE INVENTION

Field of the Invention

The present invention relates to an improvement in an abnormality display device for an electronic apparatus.

Description of the Related Art

A plurality of independent power sources are used for electronic apparatuses such as personal computers and so on. In these power sources, a rising sequence of the power sources is regulated. In the electronic apparatuses of this kind, there is known a technology that turns on or turns out an exclusive display element such as an LED and so on in order to determine whether an abnormality occurs in either power source when each system of the electronic apparatuses is not actuated (see JPH4-172539A).

In addition, in electronic apparatuses used for servers there is also known a technology that performs a state monitoring of power sources, temperature, memory, bus, and so on, and turns on and turns off the power sources from a remote place, based on IPM (Interpersonal Message) specifications such as BMC (Baseboard Management Controller).

In JPH4-172539A, there is disclosed a technology that includes a device which generates abnormality status information of the power sources and display elements which display the abnormal state of the power sources, and that changes a flash display manner of the display elements in accordance with a type of abnormality of the power sources, in order to determine the abnormality of the power sources every the type of abnormality.

SUMMARY OF THE INVENTION

The technology disclosed in JPH4-172539A makes it possible to determine the abnormality of the power sources every the type of abnormality. However, if the conventional technology is applied to an electronic apparatus having a plurality of power sources, it is required to prepare exclusive display elements used to determine the type of the abnormality in accordance with the number of the power sources and a microcomputer or the like that controls the display elements. Consequently, there are problems in that a cost of the electronic apparatus and a mounted area of the display elements are increased, and so on.

The present invention is made in view of the problems of the conventional technology and it is an object to provide an abnormality display device for an electronic apparatus capable of accomplishing commonization of a display element used to show whether an abnormality occurs in any system voltage of system voltages and a display element used for other display.

To accomplish the above object, an abnormality display device for an electronic apparatus according to the present invention includes power source circuits each generating a system voltage, that are used in each of systems of an electronic apparatus; a voltage monitoring circuit that turns on an input power source of the electronic apparatus and detects whether each system voltage normally rises before the electronic apparatus rises; at least one display element in which a signal from the voltage monitoring circuit is input and that shows whether an abnormality occurs in any of system voltages; and a switching element in which a switching signal is input after each system voltage rises.

The switching signal switches the display element from a display mode used to show the abnormality of each system voltage to a display mode other than the display mode used to show the abnormality of each system voltage, and the display element being switched from the display mode used to show the abnormality of each system voltage to the display mode other than the display mode used to show the abnormality of each system voltage.

DESCRIPTION OF THE PREFERRED EMBODIMENTS

Embodiments of an abnormality display device for an electronic apparatus according to the present invention will be described hereinafter in detail with reference to the accompanying drawings.

Figure 1:
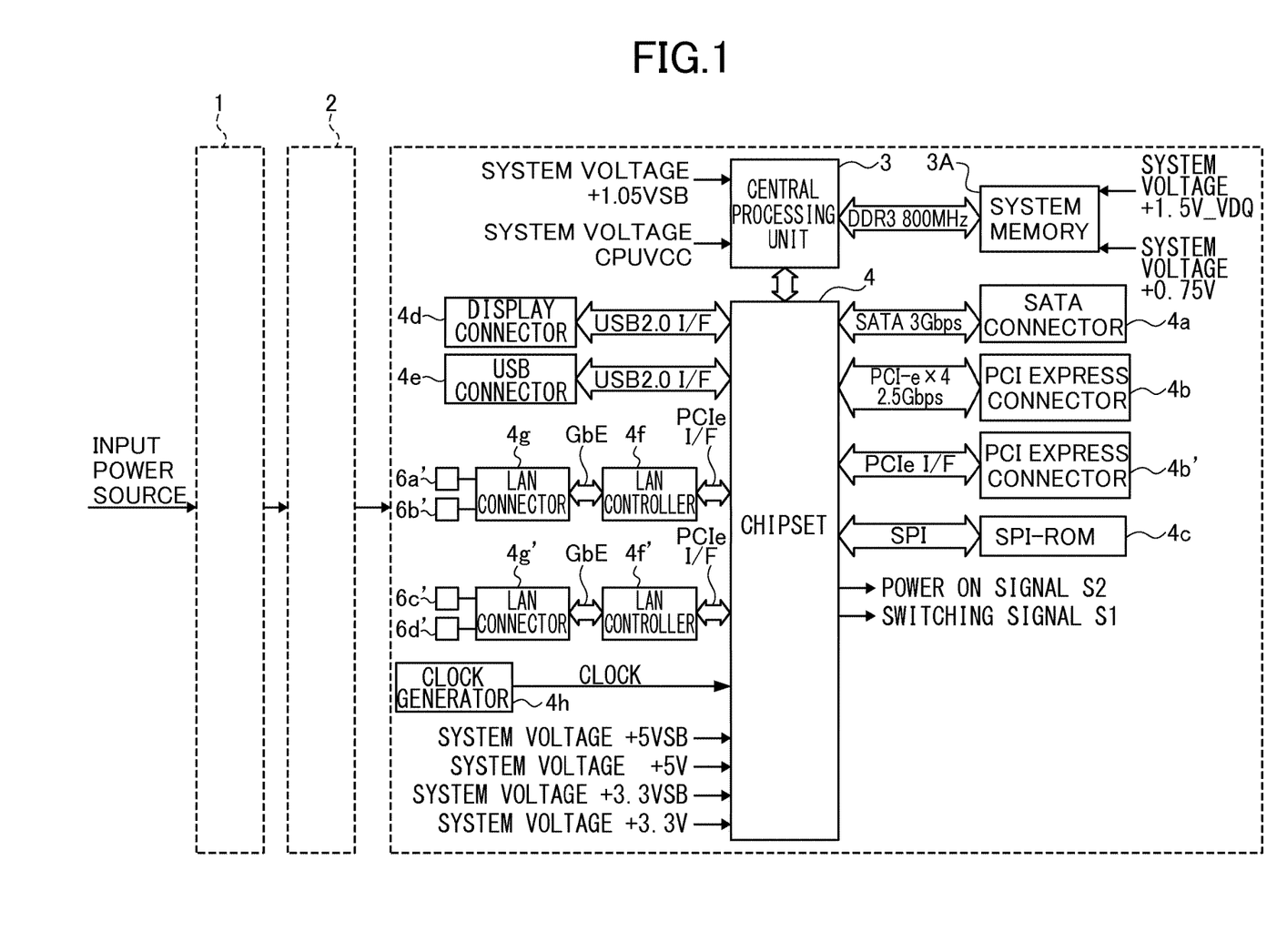
FIG. 1 is a system chart showing an entire configuration of an electronic apparatus according to an embodiment of the present invention.

FIG. 1 illustrates an entire configuration of the electronic apparatus to which the abnormality display device according to the present invention is applied. In FIG. 1, reference number 1 shows a power source circuit, reference number 2 a voltage monitoring circuit, reference number 3 a central processing unit (CPU), and reference number 4 a chipset.

Figure 2:
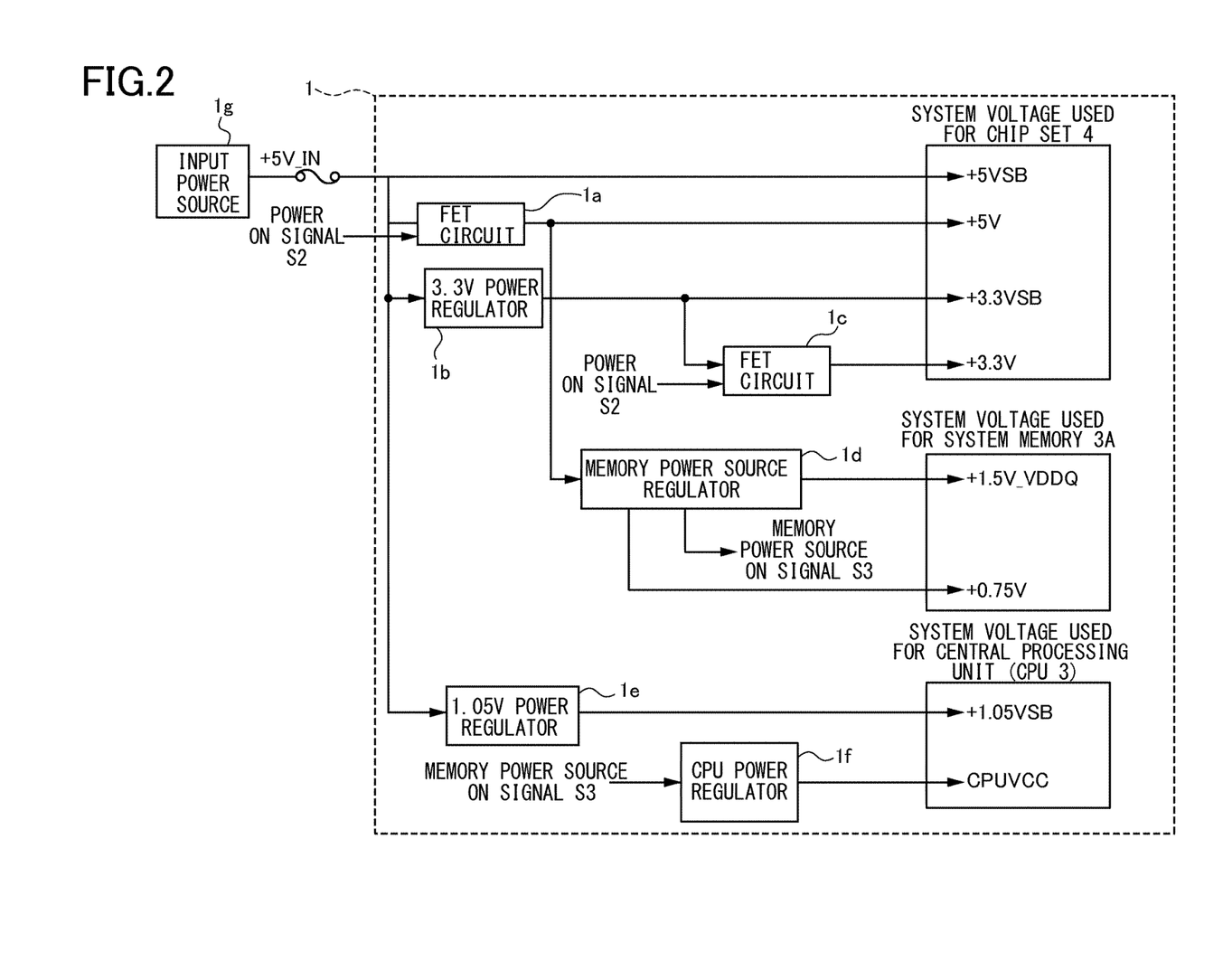
FIG. 2 is a block circuit diagram showing a detailed configuration of a power source circuit and a voltage monitoring circuit shown in FIG. 1.

In an embodiment as illustrated, the power source circuit 1 includes an FET circuit 1a, a 3.3V-power source regulator 1b, an FET circuit 1c, a memory power source regulator 1d, a 1.05V-power source regulator 1e, and a CPU power source regulator 1f, as shown in FIG. 2.

The input voltage of 5 volts is input in the power source circuit 1 from an input power source 1g through a fuse. The power source circuit 1 has a function to generate a voltage of each of systems used inside the electronic apparatus in accordance with the input voltage.

Figure 4:
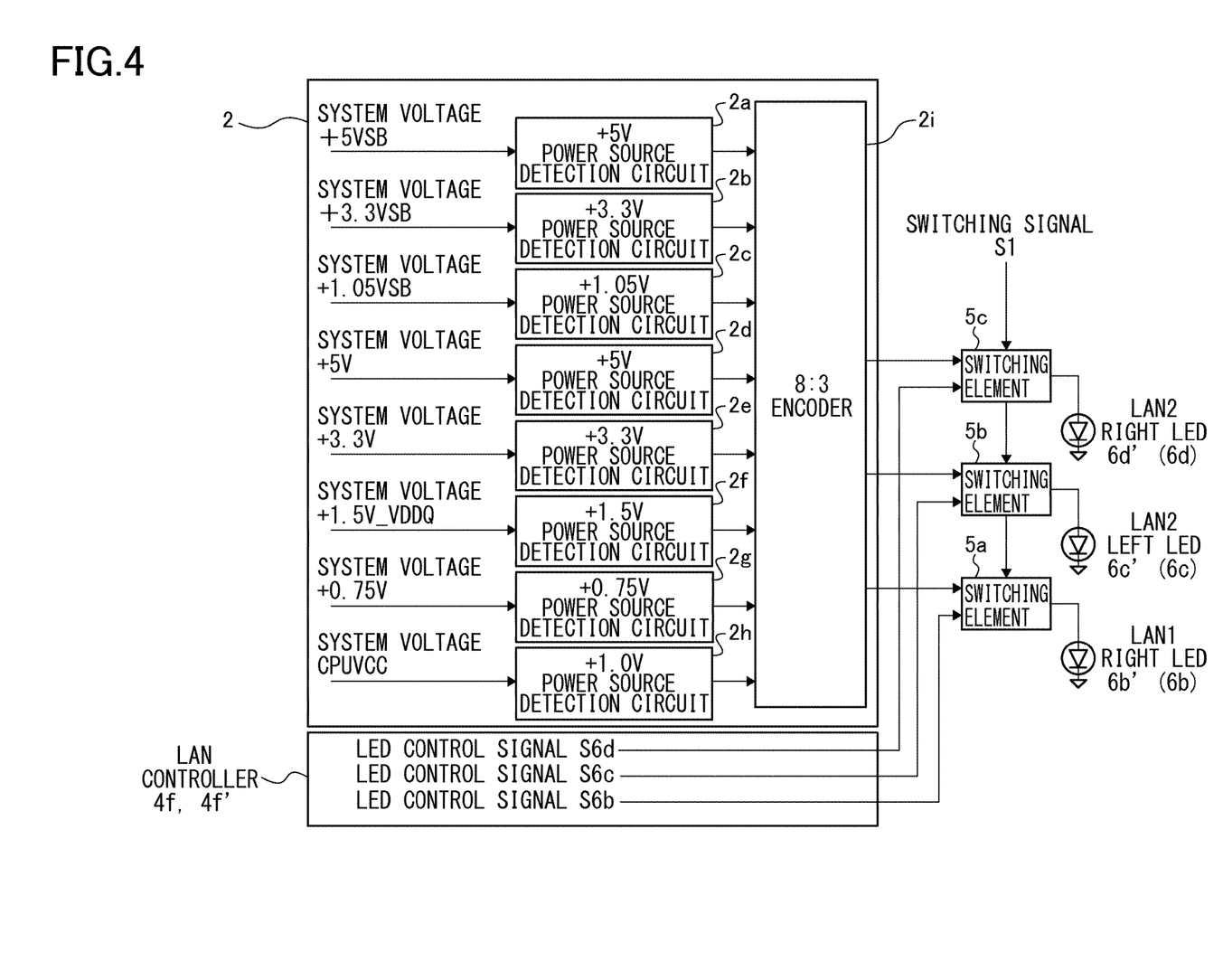
FIG. 4 is a timing chart showing a detailed configuration of the voltage monitoring circuit shown in FIG. 2.

Each system voltage generated by the power source circuit 1 is input in the voltage monitoring circuit 2 as shown in FIG. 4. The voltage monitoring circuit 2 turns on the input power source of the electronic apparatus and has a function to detect whether each system voltage normally rises up until before the electronic apparatus rises. A detailed configuration of the voltage monitoring circuit 2 is described hereinafter. The entire configuration of the system of the electronic apparatus is first described.

The central processing unit (CPU) 3 is configured to receive/transmit communication information with a system memory 3A through a DDR3 port at the frequency of 800 MHz. The chipset 4 has a function to execute operation management of various types of electronic apparatuses connected to the central processing unit (CPU) 3. Each of various electronic apparatuses such as a SATA (Serial Advanced Technology Attachment) connector 4a, a PCI, Express connectors 4b, 4b', an SPI-ROM 4c, a display connector 4d, a USB connector 4a, LAN controllers 4f, 4f', LAN connectors 4g,4g' and so on is connected to the chipset 4 (see FIG. 1). A clock signal is input from a clock generator 4h in the chipset 4.

The system voltage of +5VSB, the system voltages, +5V, +3.3VSB and +3.3V are input in the chipset 4. The chipset 6 outputs a switching signal S1 and a power-on signal S2 which have functions as described below.

The SAT connector 4a is configured to receive/transmit communication information with the chipset 4 through a SATA. port at 3 Gbps.

The PCI Express connector 4b is configured to receive/transmit communication information with the chipset 4 through a PCI-eX4 port at 2.5 Gbps.

The PCI Express connector 4b' is configured to receive/transmit communication information with the chipset 4 through a PCIe I/F.

The SPI-ROM4c is configured to receive/transmit communication information with the chipset 4 through an SPI port.

The display connector 4d is configured to receive/transmit communication information with the chipset 4 through a USB2.0 I/F port.

The USB connector 4e is configured to receive/transmit communication information with the chipset 4 through a USB2.0 I/F port.

The LAN controllers 4f and 4f' are configured to receive/transmit communication information with the chipset 4 through PCIe I/F.

The LAN controllers 4f and 4f' are configured to receive/transmit communication information with the LAN connectors 4g and 4g' through GbE.

The system voltages time-serially used inside the system in accordance with a predetermined sequence are generated in the electronic apparatuses.

Figure 3:
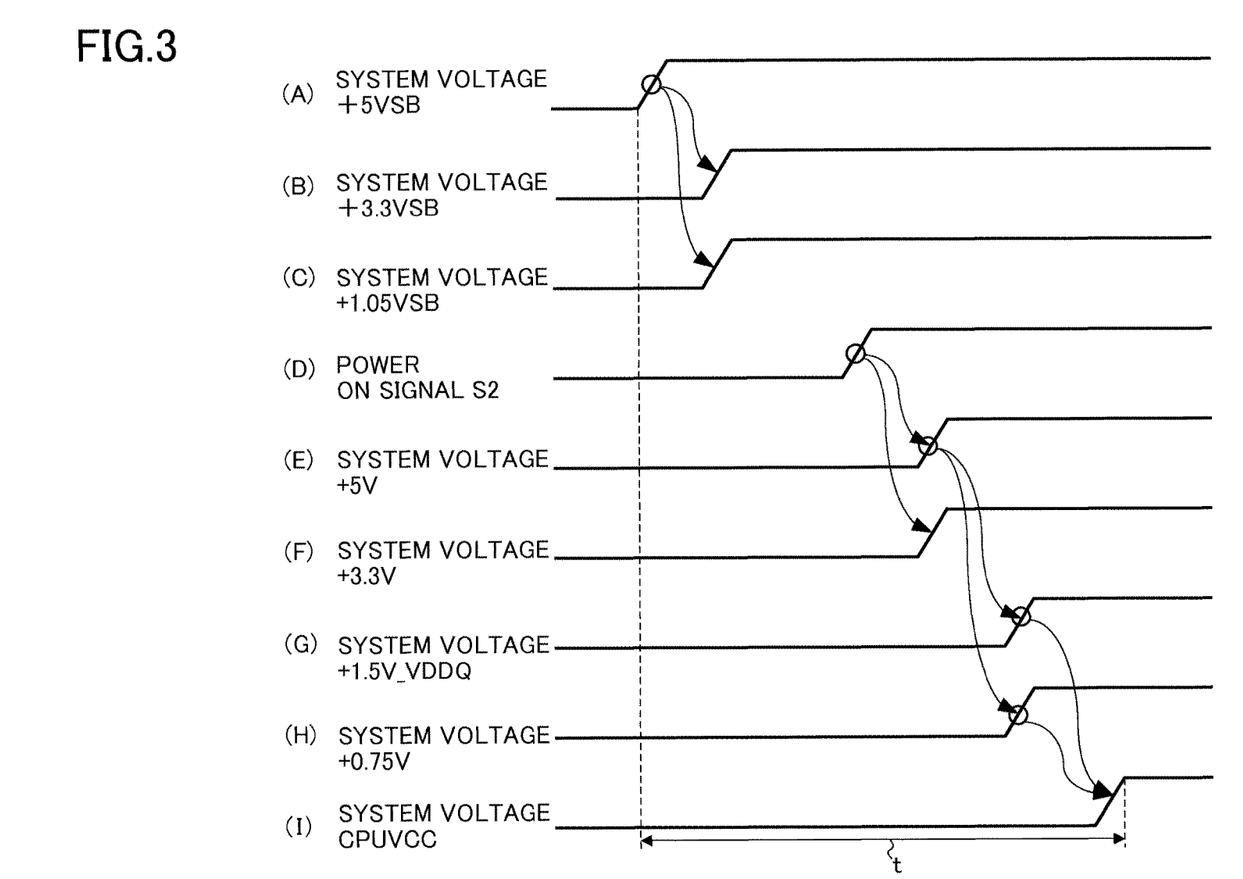
FIG. 3 is a timing chart showing a start of each voltage, wherein (A) to (I) of FIG. 3 show each system voltage.

(A) to (I) of FIG. 3 illustrate timing charts each showing timing at the time each system voltage rises.

When the input power source 1g is turned on, input voltage+5V_IN is output as the system voltage +5VSB, as shown in (A) of FIG. 3. In addition, the input voltage+5V_IN is input in the +3.3V-power source regulator 1b and the 1.05V-power source regulator 1e.

The +3.3V-power source regulator 1b outputs, when the input voltage+5V_IN is input therein, a system voltage+3.3VSB (vestigial sideband), as shown in (B) of FIG. 3, and the 1.05V-power source regulator 1e outputs, when the input voltage+5V_IN is input therein, a system voltage+1.05VSB, as shown in (C) of FIG. 3.

The chipset 4 outputs, when the system voltages, the+5VSB and the +3.3VSB are stabilized, the power-on signal S2 shown in (D) of FIG. 3 to the FET circuits 1a and 1c shown in FIG. 2.

The FET circuit 1a outputs, when the power-on signal S2 is input therein, system voltage +5V, as shown in (E) of FIG. 3. The system voltage +5V from the FET circuit 1a are input in the memory power source regulator 1d.

The FET circuit 1c outputs, when the power-on signal S2 is input therein, system voltage +3.3V, shown in (F) of FIG. 3.

The memory power source regulator 1d outputs, when the system voltage +5V are input therein from the FET circuit 1a, system voltage +1.5 VDDQ shown in (G) of FIG. 3 and system voltage +0.75V shown in (H) of FIG. 3, and a memory power source on-signal (memory power source on-signal) S3. Additionally, these system voltages are used for the system memory 3A.

The CPU power source regulator if outputs, when the memory power source on-signal S3 is input therein, system voltage CPUVCC used for the central processing unit, as shown in (I) of FIG. 3.

The voltage monitoring circuit 2 includes, as shown in FIG. 4, a +5V power source detection circuit 2a detecting whether the system voltage +5VSB normally rises, a +3.3 V-power source detection circuit 2b detecting whether the system voltage +3.3VSB normally rises, a +1.05V power source detection circuit 2c detecting whether the system voltage +1.05 VSB normally rises, a +5V-power source detection circuit 2d detecting whether the system voltage +5V normally rises, a +3.3V-power source detection circuit 2e detecting whether the system voltage +3.3V normally rises, a +1.5V-power source detection circuit 2f detecting whether the system voltage +1.5V_VDDQ normally rises, a +0.75V-power source detection circuit 2g detecting whether the system voltage +0.75V normally rises, and a +1.0V-power source detection circuit 2h detecting whether the system voltage CPUVCC normally rises.

Detection information of each of the power source detection circuits 2a to 2h is input in an 8:3 encoder 2i. The 8:3 encoder 2i encodes detection information of each of the system voltages and has a function to output a lighting control signal showing whether an abnormality occurs in each system voltage to display elements 6b to 6d (see FIG. 4) through switching elements 5a to 5c which are discussed below. Note that the abnormality display device is not limited to this configuration, may be configured by providing at least one display element and a switching element connected to the display element.

An example of the detection information is shown in the following Table 1.

TABLE 1

| | DETECTED POWER SOURCES | | | | | | | | LEDS FOR INDICATION | | | |
|---|---|---|---|---|---|---|---|---|---|---|---|---|
| | | | | | | | | | LAN1 LEFT LED | LAN1 RIGHT LED | LAN2 LEFT LED | LAN2 RIGHT LED |
| | +5VSB | +3.3VSB | +1.05VSB | +5V | +3.3V | +1.5V_VDDQ | +0.75V | CPUVCC | 6a' (6a) | 6b' (6b) | 6c' (6c) | 6d' (6d) |
| | OFF | OFF | OFF | OFF | OFF | OFF | OFF | OFF | TURN-OFF | TURN-OFF | TURN-OFF | TURN-OFF |
| | ON | OFF | OFF | OFF | OFF | OFF | OFF | OFF | TURN-OFF | TURN-OFF | TURN-OFF | TURN-ON |
| | ON | ON | OFF | OFF | OFF | OFF | OFF | OFF | TURN-OFF | TURN-OFF | TURN-ON | TURN-OFF |
| | ON | ON | ON | OFF | OFF | OFF | OFF | OFF | TURN-OFF | TURN-OFF | TURN-ON | TURN-ON |
| | ON | ON | ON | ON | OFF | OFF | OFF | OFF | TURN-OFF | TURN-OFF | TURN-OFF | TURN-OFF |
| | ON | ON | ON | ON | ON | OFF | OFF | OFF | TURN-OFF | TURN-ON | TURN-OFF | TURN-ON |
| | ON | ON | ON | ON | ON | ON | OFF | OFF | TURN-OFF | TURN-ON | TURN-ON | TURN-OFF |
| | ON | ON | ON | ON | ON | ON | ON | OFF | TURN-OFF | TURN-ON | TURN-ON | TURN-ON |

In Table 1, each of left items shows detected information of each system voltage by the power source detection circuit and each of right items shows a display state of each of the display elements 6b to 6d. A relationship between display of the display elements 6b to 6d and abnormality of the system voltages is described hereinafter.

Three LEDs of LEDs 6a' to 6d' provided in the LAN connectors 4g and 4g' are used for the display elements 6b to 6d.

Here, the LED 6b' to 6d' are used for the display elements 6b to 6d to use the LED 6a' as a LAN 1 left LED, the LED 6b' as a LAN 1 right LED, the LED 6c' as a LAN 2 left LED, and the LED 6d' as a LAN 2 right LED, conveniently. Meanwhile, the LED 6a' is used to determine an abnormality of the system after all the system voltages normally rise and turned off when the power source voltage rises.

A switching signal S1 is input in the switching elements 5a to 5c (see FIG. 4). The switching signal S1 has a function to switch the display elements from a display mode that is used to show an abnormality of each system voltage into a display mode other than the display mode that is used to show the abnormality of each system voltage, after each system voltage normally rises.

Here, if an abnormality occurs in the system after each system voltage rises, system abnormality control signals as LED control signals S6b to S6c (see FIG. 4) showing the abnormality of the system from the LAN controllers 4f, 4f' are input in the display elements 6b to 6d through the switching elements 5a to 5d.

Consequently, after each system voltage rises, the display elements are switched by the switching signal S1 from the display mode that is used to show the abnormality of each system voltage into the display mode other than the display mode that is used to show the abnormality of each system voltage.

(One Example of Abnormality of System Voltages)

Encode information of the 8:3 encoder 2i is configured to turn off all the display elements 6b to 6d when the all the system voltages are turned off. Only the display element 6d is turned on, when the system voltage +5VSB are turned on and the other system voltages are turned off. Only the display element 6c is turned on, when the system voltage +5VSB and the system voltage +3.3VSB are turned on and all the other system voltages are turned off. The display element 6b is turned off and the display elements 6c, 6d are turned on, when the system voltage +5VSB, the system voltage +3.3VSB and the system voltage +1.05 VSB are turned on and the other system voltages are turned off. All the display elements 6b to 6d are turned off, when the system voltage +5VSB, the system voltage +3.3VSB, the system voltage +1.05 VSB and the system voltage+5V are turned on and the other system voltages are turned off. The display elements 6b, 6d are turned and the display element 6c is turned off, when the system voltage +5VSB, the system voltage +3.3VSB, the system voltage +1.05 VSB, the system voltage+5V and the system voltage+3.3V are turned on and the other system voltages are turned off. The display elements 6b, 6c are turned on and the display element 6d is turned off, when the system voltage +5VSB, the system voltage +3.3VSB, the system voltage +1.05 VSB, the system voltage+5V, the system voltage +3.3V and the system voltage +1.5V_VDDQ are turned on and the remaining two system voltages are turned off. Then, the display elements 6b to 6d are turned on, when the system voltage +5VSB, the system voltage +3.3VSB, the system voltage +1.05 VSB, the system voltage +5V, the system voltage +3.3V, the system voltage +1.5V_VDDQ and the system voltage +0.75V are turned on and the system voltage CPUVC is turned off.

For example, according to the encoder information, it can be determined that, if the display elements 6a and 6d are turned off and the display element 6c is turned on, the power source regarding the system voltage +3.3VSB is normal and the power source regarding the system voltage +1.05VSB is abnormal.

In addition, for example, it can be determined that the system voltage CPUVCC does not normally rise, when all the display elements 6b to 6d are turned on and the display element 6a is turned off. When the system voltage CPUVCC normally rises, all of the LEDs 6a to 6d are turned on.

When all of the system voltages rise, the chip set outputs the switching signal S1 to the switching elements 5a to 5c, if a system abnormality occurs, the LED control signals S6b to S6d are input in the switching elements 5a to 5c.

Meanwhile, a time t (see FIG. 3) from the start of the rising of the power sources up to the generation of the system voltage CPUVCC is usually a degree of 100 ms. Therefore, a system generation voltage rises in accordance with the rising sequence, thereby even if the display elements 6b to 6d flash, the flashing is usually almost not visible. Because the flashing state of the display elements 6b to 6d can be confirmed only when the abnormality occurs in the system voltages, it is possible to recognize whether abnormality occurs in any of the power sources.

(Effect of the Invention)

According to the present invention, because the display element in which the signal from the voltage monitoring circuit is input and which shows whether the abnormality occurs in any of the system voltages is configured to be switched from the display mode used to show the abnormality of each system voltage to the display mode other than the display mode used to show the abnormality of each system voltage rises, it is possible to accomplish the commonizing of the display element.

According to the present embodiment, because the display elements 6b' to 6d' which are used for the display of usual use in which an abnormality does not occur in the power sources and the display elements 6b to 6d which are used to determine the type of the abnormality are commonized, the number of the display elements 6b to 6d can be reduced by the commonized part.

For example, it is possible to reduce cost up of the electronic apparatus by providing an exclusive display element, cost up of the electronic apparatus by providing a microcomputer and so on for controlling the exclusive display element, and increment of the mounting area of the display element, and so on.

Although the embodiments of the present invention have been described, it should be understood that the present invention is not limited to these embodiments, various changes and modifications can be made to the embodiments.

What is claimed is:

1. An abnormality display device for an electronic apparatus comprising:
   power source circuits, each of the power source circuits being configured to generate a system voltage, respectively useable in each of a plurality of systems of an electronic apparatus;
   a voltage monitoring circuit to respectively detect one of normal operation and an abnormality of the system voltage for each of the respective plurality of systems;
   a plurality of display elements to receive an input signal from the voltage monitoring circuit for each of the respective plurality of systems, and to indicate a detected system voltage abnormality in any of the plurality of systems; and
   a switch to receive an input switching signal, wherein the switching signal is configured to switch the plurality of display elements to a display mode to indicate abnormality of a system voltage in at least one of the plurality of systems, upon an abnormality being detected, and to another display mode upon an abnormality not being detected, wherein the number of the plurality of display elements is less than the number of the plurality of systems of the electronic apparatus.

2. The abnormality display device for an electronic apparatus according to claim 1, wherein the switch is further configured to receive the input switching signal after the system voltage of each of the plurality of systems rises from an initial level, wherein the switching signal is configured to switch the plurality of display elements to concurrently indicate any detected abnormality in at least one of the plurality of systems, upon at least one abnormality being detected, and to concurrently indicate normal operation of all other ones of the plurality of systems for which an abnormality is not detected, and
   wherein the plurality of display elements are configured to receive a system abnormality control signal input through the switch, after the system voltage rises from an initial level.

3. The abnormality display device for an electronic apparatus according to claim 1, further comprising:
   a central processing unit and a chip set managing an operation of the electronic apparatus,
   wherein the switching signal is configured to switch the plurality of display elements to concurrently indicate any detected abnormality in at least one of the plurality of systems, upon at least one abnormality being detected, and to concurrently indicate normal operation of all other ones of the plurality of systems for which an abnormality is not detected, and
   wherein the voltage monitoring circuit is configured to encode detection information of each of the system voltages of the plurality of systems and is configured to output a lighting control signal indicating the detected abnormality in any of the system voltages to the plurality of display elements through the switch.

4. The abnormality display device for an electronic apparatus according to claim 2, further comprising:
   a central processing unit and a chip set managing an operation of the electronic apparatus, wherein the switching signal is configured to switch the plurality of display elements to concurrently indicate any detected abnormality in at least one of the plurality of systems, upon at least one abnormality being detected, and to concurrently indicate normal operation of all other ones of the plurality of systems for which an abnormality is not detected, and
   wherein the voltage monitoring circuit is configured to encode detection information of each of the system voltages of the plurality of systems and is configured to output a lighting control signal indicating the detected abnormality in any of the system voltages to the plurality of display elements through the switch.

5. The abnormality display device for an electronic apparatus according to claim 3, wherein the system voltages of at least two of the plurality of systems are serially monitored in the voltage monitoring circuit, and
   the voltage monitoring circuit is configured to serially detect abnormalities of at least two of the system voltages of the plurality of systems.

6. The abnormality display device for an electronic apparatus according to claim 4, wherein each of the system voltages of the plurality of systems is serially monitored in the voltage monitoring circuit, and
   the voltage monitoring circuit is configured to serially detect abnormalities of at least some of the system voltages of the plurality of systems.

7. The abnormality display device for an electronic apparatus according to claim 3, wherein the chip set is configured to output the switching signal.

8. The abnormality display device for an electronic apparatus according to claim 4, wherein the chip set is configured to output the switching signal.

9. The abnormality display device for an electronic apparatus according to claim 1, wherein the plurality of display elements include LEDs, each provided in a LAN connector, and the plurality of display elements are each configured to receive, through the switch, a system abnormality control signal from a LAN controller.

10. The abnormality display device for an electronic apparatus according to claim 2, wherein the plurality of display elements include LEDs, each provided in a LAN connector, and the plurality of display elements are each configured to receive, through the switch, a system abnormality control signal from a LAN controller.

11. The abnormality display device for an electronic apparatus according to claim 3, wherein the plurality of display elements include LEDs, each provided in a LAN connector, and the plurality of display elements are each configured to receive, through the switch, a system abnormality control signal from a LAN controller.

12. The abnormality display device for an electronic apparatus according to claim 4, wherein the plurality of display include LEDs, each provided in a LAN connector, and the plurality of display elements are each configured to receive, through the switch, a system abnormality control signal from a LAN controller.

13. The abnormality display device for an electronic apparatus according to claim 1, wherein different ones of the plurality of display elements indicate the abnormality for different ones of the plurality of systems of the electronic apparatus.

14. The abnormality display device for an electronic apparatus according to claim 2, wherein different ones of the plurality of display elements indicate the abnormality for different ones of the plurality of systems of the electronic apparatus.

15. The abnormality display device for an electronic apparatus according to claim 1, wherein the plurality of display elements are configured to receive an input signal from the voltage monitoring circuit for each of the respective plurality of systems and to concurrently indicate one of normal operation and a detected abnormality for each of the plurality of systems, and wherein, based upon the received input signals, the plurality of display elements are configured to concurrently indicate a detected abnormality in at least one of the plurality of systems, upon an abnormality being detected, and indicate normal operation of the ones of the plurality of systems for which an abnormality is not detected.

* * * * *